United States Patent
Dorfman

(10) Patent No.: US 8,557,146 B1
(45) Date of Patent: Oct. 15, 2013

(54) POLYMER THICK FILM SOLDER ALLOY/METAL CONDUCTOR COMPOSITIONS

(75) Inventor: Jay Robert Dorfman, Durham, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 95 days.

(21) Appl. No.: 13/430,036

(22) Filed: Mar. 26, 2012

(51) Int. Cl.
*H01B 1/22* (2006.01)
*B05D 5/12* (2006.01)

(52) U.S. Cl.
USPC ............................ 252/512; 252/514; 427/96.1

(58) Field of Classification Search
USPC ......... 252/512–514, 518.1; 427/58, 96.1, 101
See application file for complete search history.

(56) References Cited

U.S. PATENT DOCUMENTS

| | | | |
|---|---|---|---|
| 5,062,896 A | 11/1991 | Huang et al. | |
| 7,857,998 B2 * | 12/2010 | Dorfman | 252/514 |
| 2010/0084757 A1 | 4/2010 | Hariharan et al. | |
| 2010/0252616 A1 | 10/2010 | Shearer et al. | |
| 2011/0049439 A1 * | 3/2011 | Higuchi et al. | 252/512 |
| 2011/0171372 A1 | 7/2011 | Shearer et al. | |
| 2012/0328361 A1 * | 12/2012 | Liu et al. | 403/272 |

* cited by examiner

*Primary Examiner* — Mark Kopec

(57) ABSTRACT

This invention provides a polymer thick film conductor composition comprising (a) a solder alloy powder selected from the group consisting of (i) a tin, silver, and copper alloy powder, (ii) a tin and bismuth alloy powder, and (iii) mixtures thereof, (b) a metal selected from the group consisting of silver, copper, gold, aluminum and mixtures thereof, and (c) an organic medium comprising a resin that is a vinyl copolymer resin of vinylidene chloride and acrylonitrile or a phenoxy resin dissolved in an organic solvent, wherein the solder alloy powder and the metal are dispersed in the organic medium.

14 Claims, No Drawings

POLYMER THICK FILM SOLDER ALLOY/METAL CONDUCTOR COMPOSITIONS

FIELD OF THE INVENTION

The invention is directed to polymer thick film (PTF) solder alloy/metal conductor compositions for use in many different applications. In one embodiment, the PTF solder alloy/metal composition is used as a screen-printed conductor on a thin film substrate such as ITO-sputtered glass. The PTF solder alloy/metal functions as a grid electrode. This composition may further be used for any other application where conductivity (low resistivity) is required.

BACKGROUND OF THE INVENTION

This invention is directed to a polymer thick film solder alloy/metal composition for use in electronic devices. PTF silver conductors are quite prevalent in electronic circuitry as the conductor of choice due to their low resistivity (<50 milliohms/sq) and reliability. However, in recent years, the price of silver has tripled to the order of more than $30/troy oz and it is therefore becoming too expensive to use in circuitry. Alternatives to silver are being sought with little compromise in electrical properties but at reduced cost. It is the intent of this invention to provide such an alternative.

SUMMARY OF THE INVENTION

This invention provides a polymer thick film conductor composition comprising:
 (a) 35 to 94 wt % solder alloy powder selected from the group consisting of (i) a tin, silver, and copper alloy powder, (ii) a tin and bismuth alloy powder, and (iii) mixtures thereof, the alloy powder consisting of particles possessing an average particle size of 2 to 18 µm and a surface area/mass ratio in the range of 0.20 to 1.3 $m^2/g$;
 (b) 1 to 30 wt % metal selected from the group consisting of silver, copper, gold, aluminum and mixtures thereof, the metal consisting of particles possessing an average particle size of 2 to 18 µm and a surface area/mass ratio in the range of 0.10 to 2.3 $m^2/g$; and
 (c) 5 to 35 wt % organic medium comprising:
  (1) a resin that is a vinyl co-polymer resin of vinylidene chloride and acrylonitrile or a phenoxy resin; dissolved in
  (2) organic solvent comprising a dibasic ester or glycol ether;
with the proviso that if the resin is a phenoxy resin the metal is silver;
wherein the solder alloy powder and the metal are dispersed in the organic medium and wherein the wt % are based on the total weight of the polymer thick film conductor composition.

The composition may be processed at a time and temperature necessary to remove all solvent.

The invention is further directed to a method of electrode formation on circuits using such compositions and to articles formed from such method and composition.

DETAILED DESCRIPTION OF INVENTION

Generally, a thick film composition comprises a functional phase that imparts appropriate electrically functional properties to the composition. The functional phase comprises electrically functional powders dispersed in an organic medium that acts as a carrier for the functional phase. Generally, in thick film technology, the composition is fired to burn out the organics and to impart the electrically functional properties. However, in the case of polymer thick films, the organics remain as an integral part of the composition after drying. "Organics" as used herein comprise polymer, resin or binder components of a thick film composition. These terms may be used interchangeably and they all mean the same thing.

In one embodiment, the polymer thick film solder alloy/metal conductor composition uses SAC (tin, silver, copper) alloy powder and silver flakes. In another embodiment, the composition uses SAC alloy powder and silver powder with spherical particles. In still another embodiment, the composition uses SAC alloy powder and copper flakes. In yet another embodiment, the composition uses a combination of SAC alloy and Sn/Bi alloy powders with silver flakes.

To summarize, the main components of the polymer thick film solder alloy/metal conductor composition are conductor powders dispersed in an organic medium, which is comprised of polymer resin and solvent. The components are discussed herein below.

A. Conductor Powders

The electrically functional powders in the present thick film composition are (1) solder alloy conductor powders that contain tin, silver, and copper, known as SAC alloys, with tin the largest percentage, i.e. greater than 90% by weight or Sn/Bi alloy powders with at least 40 wt % tin and (2) metal powders/flakes of silver, copper, gold, aluminum or mixtures thereof.

The particle diameter and shape used on both the solder alloy powders and pure metal are particularly important and have to be appropriate to the application method. The particle size distribution of both the solder alloy particles and pure metal is also critical with respect to the effectiveness of the composition. As a practical matter, the particle size is in the range of 1 to 100 µm. In an embodiment, the average particle size of both the solder alloy particles and the metal particles is 2 to 18 µm. In addition, the surface area/weight ratio of the solder alloy particles is in the range of 0.20 to 1.3 $m^2/g$, while that of the metal particles is 0.10 to 2.3 $m^2/g$. In one embodiment, the metal is silver and/or copper. In another embodiment, the metal is silver. In one embodiment, the PTF composition comprises 35 to 94 wt % solder alloy powder and 1 to 30 wt % metal, wherein the wt % are based on the total weight of the polymer thick film conductor composition. In another embodiment, the PTF composition comprises 60 to 75 wt % solder alloy powder and 15 to 30 wt % metal. In this embodiment, the metal is ⅙ to ⅓ of the total amount of solder alloy powder and metal in the composition.

An organic acid may be used as a reductant for the solder alloy to reduce any oxidation of the solder alloy surface.

B. Organic Medium

The solder alloy conductor powder and the metal are typically mixed with an organic medium, i.e., an organic vehicle, by mechanical mixing to form a paste-like composition, called "paste", having suitable consistency and rheology for printing. The organic medium must be one in which the solids, i.e., the solder alloy conductor powder and the metal, are dispersible with an adequate degree of stability. The rheological properties of the organic medium must be such that they lend good application properties to the composition. Such properties include: dispersion of solids with an adequate degree of stability, good application of composition, appropriate viscosity, thixotropy, appropriate wettability of the substrate and the solids, a good drying rate, and dried film strength sufficient to withstand rough handling.

The organic medium comprises a solution of polymer in organic solvent(s). The organic medium of the invention is not conventional in the art and lends unique properties to the composition.

The polymer resin of the present invention is particularly important. The resin used in the present invention is a vinyl co-polymer of vinylidene chloride and acrylonitrile which allows high weight loading of solder alloy powder and thus helps achieve both good adhesion to substrates and low resistivity (high conductivity), two critical properties for conductors in electronic circuitry. Additionally, and unexpectedly, this polymer seems to act as a self-fluxing component in the pastes so no external reductant is needed. Alternatively, a phenoxy resin may be used in some formulations as well, but only when silver is the added metal.

A wide variety of inert liquids can be used as solvents in the organic medium. The most widely used solvents found in thick film compositions are ethyl acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the medium. In embodiments of the present invention, solvents such as glycol ethers, ketones, esters and other solvents of like boiling points (in the range of 180° C. to 250° C.), and mixtures thereof may be used. In one embodiment, the organic solvent comprises a dibasic ester or glycol ether. In one such embodiment the organic medium is based on dibasic esters and C-11 ketone. Various combinations of these and other solvents are formulated to obtain the viscosity and volatility requirements desired.

In an embodiment, the composition comprises 5 to 35 wt % organic medium.

Application of Thick Films

The polymer thick film solder alloy/metal composition also known as "paste" is typically deposited on a substrate, such as ITO-sputtered glass, that is essentially impermeable to gases and moisture. The substrate can also be a sheet of flexible material. An example is an impermeable plastic such as a composite material made up of a combination of plastic sheet with optional metallic or dielectric layers deposited thereupon. The substrate must be such as to withstand the processing temperature of 160° C. In one embodiment, the substrate can be a build-up of layers with metalized solder alloy paste.

The deposition of the polymer thick film solder alloy/metal composition is performed preferably by screen printing, although other deposition techniques such as stencil printing, syringe dispensing or coating techniques can be utilized. In the case of screen-printing, the screen mesh size controls the thickness of the deposited thick film.

The deposited thick film is dried by exposure to heat for typically 10-15 min at 160° C.

The composition of this invention provides conductors with unusually low resistivity, i.e., <50 milliohm/sq. Additionally, this is achieved with a drying temperature approximately 60° C. below the liquidus temperature 217° C. of one of the solder alloys, e.g., SAC305. The result is very low circuit resistance achieved at low cost and at such a low drying temperature of 160° C.

The present invention will be discussed in further detail by giving practical examples. The scope of the present invention, however, is not limited in any way by these practical examples.

EXAMPLES

Example 1

The PTF solder alloy/metal conductor paste was prepared by mixing solder alloy powder SAC305 (AMTECH, SMT International LLC, Deep River, CN) with an average spherical particle size of 10 μm (range was 5-15 μm) and silver flake with an average particle size of 5 μm with an organic medium composed of a co-polymer of vinylidene chloride and acrylonitrile resin (Saran™ F-310 resin, Dow Chemical Co., Midland, Mich.). The molecular weight of the resin was approximately 25,000. A solvent was used to dissolve the resin completely prior to adding the solder alloy powder. That solvent was a 50/50 blend of dibasic esters (DuPont Co., Wilmington, Del.) and Eastman™ C-11 Ketone solvent (Eastman Chemical, Kingsport, Tenn.).

The composition was:

| 60.0 wt % | SAC305 solder alloy powder - (96.5% Sn, 3% Ag, 0.5% Cu) |
|---|---|
| 10.0 wt % | organic medium (19.5% resin/80.5% solvent) |
| 30.0 wt % | silver flake (average size 5 μm) |

This composition was mixed for 10 minutes in a Thinky-type mixer. At this point, the composition was used to screen print a pattern on glass. Using a 280 mesh stainless steel screen, a series of lines were printed, and the PTF solder alloy/metal conductor was dried at 180° C. for 10 min. in a forced air box oven. The resistivity was then measured as 30 milliohm/sq at a thickness of 30 μm. As a comparison, a standard PTF silver composition DuPont 5025 silver conductor (DuPont Co., Wilmington, Del.) was measured as 25 milliohm/sq at a thickness of 12 μm. Although the solder alloy/metal composition has higher resistivity than the best conventional silver conductor, it is close in value at a fraction of the cost of silver.

Example 2

Another PTF solder alloy/metal composition was prepared as described in Example 1 except that the wt % of solder alloy powder and silver flake was adjusted to 70.0 wt % and 20.0 wt %, respectively. All other properties of the formulation, the solder alloy powder particle size distribution, the silver flake size and the subsequent processing were the same as Example 1. The resistivity for this composition was approximately 50 mohm/sq, which is higher than that seen for Example 1. It is apparent that an adjustment in the solder alloy/metal ratio had a minor negative impact on the resistivity of the composition.

Example 3

Another PTF solder alloy/metal composition was prepared as described in Example 1 except that the resin was changed from the vinyl co-polymer resin used in Example 1 to a phenoxyether resin, PKHH, a polyhydroxyether resin (Phenoxy Associates, Rock Hill S.C.). All other properties of the formulation, the solder alloy powder particle size distribution, the silver flake size and the subsequent processing were the same as Example 1. The resistivity for this composition was approximately 57 mohm/sq, which is slightly higher than seen for Example It is apparent that a change in resin chemistry has a minor impact on the resistivity of the composition.

Example 4

Another PTF solder alloy composition was prepared as described in Example 1 except that instead of using silver flake as the metal, a copper flake was used (Ames-Goldsmith average particle size=4 μm). Additionally, an organic acid (anisic acid) was required to achieve optimum conductivity. All other properties of the formulation, the solder alloy powder particle size distribution and the subsequent processing were the same as Example 1. The resistivity of the composition was 100 mohm/sq.

The composition was:

| | |
|---|---|
| 24.75 wt % | copper flake (average particle size = 4 μm) |
| 62.37 wt % | SAC305 solder alloy powder |
| 1.00 wt % | anisic acid |
| 11.88 wt % | organic medium (19.5% resin/80.5% solvent) |

Example 5

Another PTF solder alloy/metal composition was prepared as described in Example 1 except that instead of using silver flake as the metal, a silver powder with spherical particles was used (average particle size=2 μm) and a combination of solder alloy powders were used. The processing was the same as that given in Example 1. The resistivity of the composition was 65 mohm/sq.

The composition was:

| | |
|---|---|
| 25.0 wt % | silver powder (average particle size = 2 microns) |
| 40.0 wt % | SAC305 solder alloy powder |
| 23.0 wt % | 42 wt % Sn/58 wt % Bi solder alloy powder |
| 12.0 wt % | organic medium (19.5% resin/80.5% solvent) |

What is claimed is:

1. A polymer thick film conductor composition comprising:
    (a) 35 to 94 wt % solder alloy powder selected from the group consisting of (i) a tin, silver, and copper alloy powder, (ii) a tin and bismuth alloy powder, and (iii) mixtures thereof, said alloy powder consisting of particles possessing an average particle size of 2 to 18 μm and a surface area/mass ratio in the range of 0.20 to 1.3 $m^2/g$;
    (b) 1 to 30 wt % metal selected from the group consisting of silver, copper, gold, aluminum and mixtures thereof, said metal consisting of particles possessing an average particle size of 2 to 18 μm and a surface area/mass ratio in the range of 0.10 to 2.3 $m^2/g$; and
    (c) 5 to 35 wt % organic medium comprising:
        (1) a resin that is a vinyl co-polymer resin of vinylidene chloride and acrylonitrile or a phenoxy resin; dissolved in
        (2) organic solvent comprising a dibasic ester or glycol ether;
    with the proviso that if said resin is a phenoxy resin said metal is silver, wherein said solder alloy powder and said metal are dispersed in said organic medium and wherein the wt % are based on the total weight of the polymer thick film conductor composition.

2. The composition of claim 1, wherein said metal is silver, copper, or a mixture thereof.

3. The composition of claim 2, wherein said metal is silver.

4. The composition of claim 1, wherein said solder alloy powder is a tin, silver, and copper alloy that contains at least 90% tin by weight and wherein said organic medium contains 16 to 30% vinyl co-polymer or phenoxy resin by weight.

5. The composition of claim 1, wherein said solder alloy powder is a tin and bismuth alloy that contains at least 40% tin by weight, and wherein said organic medium contains 16 to 25% vinyl co-polymer resin by weight.

6. The composition of claim 1, wherein the boiling point of the organic solvent is in the range of 180° C. to 250° C.

7. The composition of claim 1, said composition comprising 60 to 75 wt % solder ahoy powder and 15 to 30 wt % metal.

8. The composition of claim 7, wherein said metal is silver, copper, or a mixture thereof.

9. The composition of claim 8, wherein said metal is silver.

10. The composition of claim 7, wherein said solder alloy powder is a tin, silver, and copper alloy that contains at least 90% tin by weight and wherein said organic medium contains 16 to 30% vinyl co-polymer or phenoxy resin by weight.

11. The composition of clam 7, wherein said solder alloy powder is a tin and bismuth alloy that contains at least 40% tin by weight, and wherein said organic medium contains 16 to 25% vinyl co-polymer resin by weight.

12. An electrical circuit comprising an electrode formed from the composition of any of claims 1-11, wherein the composition has been dried to form the electrode.

13. A method of forming an electrode in an electrical circuit, comprising:
    a) preparing the polymer thick film conductor composition of claim 1;
    b) applying the polymer thick film conductor composition onto a substrate; and
    c) drying the polymer thick film conductor composition to form the electrode.

14. An electrical circuit comprising an electrode formed by the method of claim 13.

* * * * *

UNITED STATES PATENT AND TRADEMARK OFFICE
CERTIFICATE OF CORRECTION

| | | |
|---|---|---|
| PATENT NO. | : 8,557,146 B1 | Page 1 of 1 |
| APPLICATION NO. | : 13/430036 | |
| DATED | : October 15, 2013 | |
| INVENTOR(S) | : Jay Robert Dorfman | |

It is certified that error appears in the above-identified patent and that said Letters Patent is hereby corrected as shown below:

In the Claims

Col. 6 in Line 25 of Claim 7, please change the word "ahoy" to read -- alloy --.

Col. 6 in Line 35 of Claim 11, please change the word "clam" to read -- claim --.

Signed and Sealed this
Twelfth Day of November, 2013

Teresa Stanek Rea
*Deputy Director of the United States Patent and Trademark Office*